(12) United States Patent
Shimizu et al.

(10) Patent No.: US 7,362,588 B2
(45) Date of Patent: Apr. 22, 2008

(54) FLYING CAPACITOR TYPE BATTERY VOLTAGE DETECTOR

(75) Inventors: Takumi Shimizu, Yokkaichi (JP); Tetsuya Kobayashi, Anjo (JP); Keisuke Tanigawa, Nishio (JP)

(73) Assignee: Denso Corporation, Kariya (JP)

( * ) Notice: Subject to any disclaimer, the term of this patent is extended or adjusted under 35 U.S.C. 154(b) by 509 days.

(21) Appl. No.: 11/037,211

(22) Filed: Jan. 19, 2005

(65) Prior Publication Data

US 2005/0189949 A1 Sep. 1, 2005

(30) Foreign Application Priority Data

Jan. 19, 2004 (JP) ............... 2004-010869

(51) Int. Cl.
*H01R 12/16* (2006.01)
(52) U.S. Cl. ............. 361/785; 361/708; 361/781; 361/782; 361/783; 361/784
(58) Field of Classification Search ........ 320/166–167; 324/434; 361/760–761, 780–785
See application file for complete search history.

(56) References Cited

U.S. PATENT DOCUMENTS

| | | | |
|---|---|---|---|
| 6,362,627 B1 * | 3/2002 | Shimamoto et al. | 324/434 |
| 6,639,408 B2 * | 10/2003 | Yudahira et al. | 324/434 |
| 6,639,409 B2 * | 10/2003 | Morimoto et al. | 324/434 |
| 7,078,908 B2 * | 7/2006 | Fujita et al. | 324/433 |

FOREIGN PATENT DOCUMENTS

| JP | A-11-248755 | 9/1999 |
|---|---|---|
| JP | A 11-272981 | 10/1999 |
| JP | A-11-273886 | 10/1999 |
| JP | A 2002-148286 | 5/2002 |

OTHER PUBLICATIONS

Christopher Morris, Acadamic Press Dictionary of Science and Technology, 1992, Harcourt Brace Jovanovich, pp. 1726 and 2125.*
Acadamic Press Dictionary of Science and Technology, Edited by Christopher Morris, Harcourt Brace Jovanovich, pp. 1726 and 2125.*
Notification of Reasons for Rejection, Patent Application No.: 2004-010869, Date of Draft: Jul. 19, 2007, Date of Dispatch: Jul. 24, 2007, Examiner: T. Takeda, Patent Attorney: Hiroshi Ohkawa, Applied Article: 2nd par. of Art. 29 (in Japanese and English).

* cited by examiner

*Primary Examiner*—Bao Q. Vu
*Assistant Examiner*—Samuel Berhanu
(74) *Attorney, Agent, or Firm*—Oliff & Berridge, PLLC

(57) ABSTRACT

In a flying capacitor type battery voltage detector on a circuit substrate, a large number of photo MOS switches having performance highly depending from temperature are dividedly disposed on front and back surfaces of the circuit substrate such that the photo MOS switches of the back surface are lying over the photo MOS switches of the front surface. Each of pairs of photo MOS switches connects a pair of surface lines with first and second floating lines to transmit an output voltage of each cell of a battery pack connected with the surface lines to a differential amplifier through a flying capacitor connected with the floating lines. Because of the division of the photo MOS switches on the surfaces of the circuit substrate, temperatures of the photo MOS switches have less dispersion, and an S/N ratio of each signal indicating the output voltage can be improved.

13 Claims, 4 Drawing Sheets

FLYING CAPACITOR TYPE BATTERY VOLTAGE DETECTOR

CROSS-REFERENCE TO RELATED APPLICATION

This application is based upon and claims the benefit of priority of the prior Japanese Patent Application 2004-10869 filed on Jan. 19, 2004 so that the contents of which are incorporated herein by reference.

BACKGROUND OF THE INVENTION

1. Field of the Invention

The present invention generally relates to a flying capacitor type battery voltage detector mounted on a vehicle, and more particular to a flying capacitor type battery voltage detector in which voltages created by cells of a battery pack is detected one by one in a predetermined order to check the performance of each cell.

2. Description of Related Art

A battery pack creating a high voltage has generally been used in a hybrid vehicle or a fuel cell electric vehicle to reduce a power loss in wires and to lessen weight of cables. The battery pack is composed of hundreds of cells connected with one another in series. In the vehicle using this battery pack, it is necessary that a control unit periodically detects a voltage created by each of the cells of the battery pack to maintain the cells in preferable operating conditions.

When a plurality of voltage detectors separately disposed are used to detect output voltages of a large number of cells of the battery pack, respectively, a size of a circuit of the voltage detectors is enormously enlarged. To reduce the circuit size, a flying capacitor type battery voltage detector has been proposed.

In this flying capacitor type battery voltage detector, a multiplexer selects cells of a battery pack one by one in a predetermined order according to a predetermined time schedule, a flying capacitor holds an output voltage of each selected cell, and a differential amplifier detects the output voltage of the cell sent from the flying capacitor through an output side analog switch.

Because only a single battery voltage detector having one multiplexer, one flying capacitor and one differential amplifier is used to detect output voltages of a large number of cells of a battery pack one by one, a size of the battery voltage detector can be reduced as compared with that of the voltage detectors prepared for the cells, respectively. In addition, because the same battery voltage detector is used for the cells of the battery pack, a degree of an error of an amplification factor and a degree of an offset error caused by the differential amplifier are substantially invariable in the detecting operations of the output voltages of the cells of the battery pack. Therefore, in addition to the simplification of the configuration of the battery voltage detector, the battery voltage detector is advantageous in that the output voltage of each cell detected by the battery voltage detector can be easily corrected.

Published Japanese Patent First Publication No. 2002-148286 discloses a conventional flying capacitor type battery voltage detector. In this battery voltage detector, a battery pack mounted on a vehicle creates a very high voltage of hundreds of volts and is insulated from the ground. Therefore, it is required to dispose a power source system of control circuits independently from the battery pack. For this requirement, a group of photo MOS (metal oxide semiconductor) switches formed in a configuration of discrete units is generally used as a group of analog switches of a multiplexer. That is, the photo MOS switches are separately disposed parallel to one another, and a plurality of pairs of photo MOS switches are used one by one to detect each of output voltages of the cells. In this case, because the battery pack is composed of hundreds of cells serially connected with one another, a large number (for example, hundreds) of photo MOS switches disposed on a substrate (hereinafter, called circuit substrate) are required to detect output voltages of the cells one by one.

The reason that the photo MOS switches are formed in the configuration of discrete units, in other words, disposed parallel to one another is described. Each photo MOS switch requires both a light emitting device (LED) and a silicon photo detector, and voltages, respectively, applied to the photo MOS switches considerably differ from one another because of the high voltage of the battery pack. Therefore, it is difficult to dispose the photo MOS switches in an integrated circuit as non-discrete units. Hereinafter, because the photo MOS switch belongs to a control voltage separation type analog switch, the photo MOS switch is sometimes called an analog switch in this specification.

However, the above-described battery voltage detector has the following problems. Because the multiplexer is composed of a large number of analog switches (or photo MOS switches), the multiplexer is inevitably disposed in a wide area of a circuit substrate. Further, a resistance (hereinafter, called an on-state resistance) of the analog switch set at an on state has a high temperature dependency, and heat received in the multiplexer is mainly transmitted from the circuit substrate. In general, heat of the circuit substrate is propagated according to the thermal conduction in plane directions perpendicular to a thickness direction of the circuit substrate. Therefore, an environment of temperature at each of portions of the circuit substrate differs from those at the other portions, and the analog switches receiving heat from the circuit substrate are set at various temperatures in a wide temperature range. That is, temperatures of the analog switches have a wide dispersion. As a result, because the on-state resistance of the analog switch is highly changed with temperature, the analog switches have various on-state resistances in a wide resistance range. In this case, when electric energy outputted from each cell is charged as an electrostatic capacity to a flying capacitor through a pair of analog switches set at on-state resistances in a short period of time, the output voltage of the cell is reduced in the analog switches by a changeable reduction value dependent from temperatures of the analog switches, and a reduced voltage applied to the flying capacitor is read out as an output voltage of the cell. Therefore, because a large number of analog switches disposed in a wide area have various on-state resistances in a wide temperature range, the reduction values of the output voltages of the cells are widely dispersed, and voltages read out one after another from the flying capacitor as the output voltages of the cells have various values in a wide voltage range. As a result, noises in voltage are superimposed on signals indicating the output voltages of the cells because of a large temperature difference in the circuit area of the multiplexer, and a signal-to-noise (SN) ratio in each signal is undesirably lowered or degraded (first problem).

Further, each of electric potentials of the positive and negative terminals of each cell is transmitted to one of the terminals of the flying capacitor through a cell side wire, an analog switch and a flying capacitor side wire to hold a voltage of the cell in the flying capacitor. Each cell side wire connects one terminal of the corresponding cell and an input terminal of the corresponding analog switch, and each flying capacitor side wire connects an output terminal of the corresponding analog switch and the corresponding terminal of the flying capacitor. After the output voltage of the cell is held in the flying capacitor, the analog switch is turned off. In this case, the flying capacitor side wire is almost or perfectly electrically insulated from the ground and is set at a floating potential condition. Further, an electromagnetic coupling and/or an electrostatic coupling inevitably occur between the flying capacitor side wire and its neighboring wire or terminal so as to superimpose noises caused by electromagnetic induction and/or electrostatic induction on an electric potential signal of the flying capacitor side wire, and/or the flying capacitor side wire inevitably receives electromagnetic waves as noises from the outside so as to superimpose the noises of the external electromagnetic waves on the electric potential signal. As a result of the occurrence of the coupling and/or the reception of the external electromagnetic waves, the electric potential of the flying capacitor side wire set at the floating potential condition is easily changed, and the voltage applied to the flying capacitor is undesirably changed with the electric potential of the flying capacitor side wire. When an output side analog switch directly connected to a differential amplifier is turned on to transmit electric potentials of the terminals of the flying capacitor to the differential amplifier, the differential amplifier detects an incorrect voltage held in the flying capacitor as the output voltage of the cell. Therefore, the SN ratio is further degraded (second problem).

In the same manner, the electric potential of the cell side wire is changed due to the coupling and/or the external electromagnetic waves, thereby the SN ratio being moreover degraded when an incorrect electric potential of the cell side wire is transmitted to the differential amplifier through a turned-on analog switch.

Further more, because the multiplexer is disposed in a wide area of the circuit substrate, the cell side wires and the flying capacitor side wires connected with the multiplexer are inevitably lengthened. Further, because it is required to ensure the electrical insulation of each wire from the other wires, each wire is disposed to be sufficiently spaced from the adjacent wire. As a result, each wire is further lengthened, and a resistance of the wire is increased. Therefore, the flying capacitor sometimes is not sufficiently charged to detect the output voltage of each cell in the differential amplifier. Further, because resistances (hereinafter, called wiring resistances) of the wires have various values in a wide resistance range, the voltages held in the flying capacitor as the output voltages of the cells have various values in a wide voltage range. As a result, the SN ratio deteriorates. Moreover, as well known, noises based on the resistance of each wire are increased with the wiring resistance, so that the SN ratio is further lowered (third problem).

The wiring resistance in the flying capacitor side wire is described in more detail. A portion (or called a potential detecting line) of each cell side wire extending from the corresponding cell to a connector of the circuit substrate is generally made of a cable, so that the wiring resistance of the portion of the cell side wire can be easily reduced. However, the remaining portions (or called potential detecting substrate surface lines) of the cell side wires extending from the connector of the circuit substrate to the analog switches of the multiplexer are disposed on a surface of the circuit substrate in high density, and the flying capacitor side lines extending from the analog switches to the flying capacitor are also disposed on the surface of the circuit substrate in high density. Therefore, the potential detecting substrate surface lines and the flying capacitor side lines are made of thinned wires. As a result, it is difficult to reduce the wiring resistances of the potential detecting substrate surface lines and the flying capacitor side lines, and the SN ratio is further lowered (fourth problem).

In short, in the conventional flying capacitor type battery voltage detector, a large number of photo MOS switches are dispersedly disposed on a surface of a circuit substrate. Therefore, an S/N ratio of a signal indicating an output voltage of each cell of a battery pack is degraded.

Further, Published Japanese Patent First Publication No. H11-272981 discloses a flying capacitor type insulation circuit. In a case where this insulation circuit is used as a flying capacitor type battery voltage detector, it is necessary to dispose a large number of analog switches formed in a configuration of discrete units on a circuit substrate as a multiplexer. Therefore, the same problems described above occur in this circuit.

SUMMARY OF THE INVENTION

An object of the present invention is to provide, with due consideration to the problems of the conventional flying capacitor type battery voltage detector, a flying capacitor type battery voltage detector in which an SN ratio of a signal indicating a voltage created in each of cells of a battery pack is improved.

According to a first aspect of this invention, the object is achieved by the provision of a flying capacitor type battery voltage detector comprising a circuit substrate having a front surface and a back surface opposite to the front surface in its thickness direction, a plurality of potential detecting substrate surface lines which are each disposed on the front or back surface of the circuit substrate, first and second floating lines which are each disposed on the front or back surface of the circuit substrate, a multiplexer, a flying capacitor connected with the first and second floating lines, and an analog switch. The potential detecting substrate surface lines are connected with a plurality of terminals of cells or groups of cells of a battery pack, respectively.

The multiplexer has both a first portion disposed on the front surface of the circuit substrate and a second portion disposed on the back surface of the circuit substrate such that the second portion substantially lies over the first portion through the circuit substrate in the thickness direction of the circuit substrate.

In operation, the analog switch is maintained in an off state. When the multiplexer sequentially connects the potential detecting substrate surface lines of each of pairs with the first and second floating lines, respectively, the terminals of one of pairs corresponding to the potential detecting substrate surface lines of the pair are connected with the first and second floating lines, respectively. The flying capacitor holds an electric energy transmitted from the terminals of the corresponding pair through the potential detecting substrate surface lines of the pair and the first and second floating lines.

When the potential detecting substrate surface lines of the pair are disconnected from the first and second floating lines, the analog switch is turned on, and the electric energy of the flying capacitor is outputted through the analog switch in the form of a signal as a function of an output voltage appearing between the terminals of the corresponding pair.

Therefore, the flying capacitor type battery voltage detector can detect the output voltages of the cells or the groups of cells of the battery pack one by one.

In addition, because the first and second portions of the multiplexer are, respectively, disposed on the front and back surfaces of the circuit substrate, each of the first and second portions of the multiplexer can be disposed in a narrower area of the circuit substrate as compared with the case where the multiplexer is disposed on only one surface of the circuit substrate. Therefore, lengths of the potential detecting substrate surface lines connected with the multiplexer and lengths of the first and second floating lines connected with the multiplexer can be shortened. In this case, noises based on electromagnetic induction and noises based on electrostatic induction can be reduced, so that an S/N ratio of each of signals indicating the output voltages can be improved. Further, because wiring resistances of the potential detecting substrate surface lines and wiring resistances of the first and second floating lines are reduced, noises based on the wiring resistances and superimposed on the signals can be reduced, and the S/N ratio of each signal can be further improved.

Further, the second portion of the multiplexer is disposed to be substantially lying over the first portion through the circuit substrate in the thickness direction of the circuit substrate. Therefore, even though the multiplexer receives, from the circuit substrate, heat propagated in the circuit substrate in plane directions perpendicular to the thickness direction according to the thermal conduction, a temperature distribution of the first portion of the multiplexer becomes almost the same as that of the second portion of the multiplexer. Therefore, temperatures in the first and second portions of the multiplexer are distributed in a narrower range as compared with the case where the second portion of the multiplexer is disposed not to be lying over the first portion. Therefore, noises based on temperatures of the multiplexer distributed in a wide range can be reduced. For example, when the multiplexer is composed of a plurality of analog switches, on-state resistances of the analog switches having a high temperature dependency are distributed in a narrow resistance range. Accordingly, degrees of reduction of the output voltages of the cells in the multiplexer can be reduced to a narrow voltage reduction range, and the S/N ratio of each signal can be improved.

According to a second aspect of this invention based on the first aspect thereof, it is preferred that the multiplexer comprises a plurality of first photo MOS switches connecting a part of the potential detecting substrate surface lines with the first floating line when being set at an on state, and a plurality of second photo MOS switches connecting the remaining part of the potential detecting substrate surface lines with the second floating line when being set at an on state, and a plurality of pairs of the first and second photo MOS switches are set at the on state one by one.

Generally, a photo MOS switch functioning as an analog switch is actuated by using electric energy obtained by the photoelectric transfer. Therefore, an on-state resistance of the photo MOS switch set at an on state is larger than that of a power switching device generally used, and the on-state resistance of the photo MOS switch has a high temperature dependency so as to be largely changed with temperature.

In this configuration, a temperature distribution of the part of the first and second photo MOS switches disposed as the first portion is almost the same as that of the remaining part of the first and second photo MOS switches disposed as the second portion, and temperatures of the first and second photo MOS switches are distributed in a narrow temperature range. Therefore, even though the photo MOS switches having a high temperature dependency are used as the multiplexer, the on-state resistances of the first and second photo MOS switches have less dispersion. Accordingly, noises based on the wide dispersion of the on-state resistances can be reduced, and an S/N ratio of each signal can be improved.

According to a third aspect of this invention based on the second aspect thereof, preferably, the first and second photo MOS switches of the second portion of the multiplexer be substantially lying over the first and second photo MOS switches of the first portion of the multiplexer through the circuit substrate in the thickness direction of the circuit substrate.

In this configuration, the on-state resistances of the first and second photo MOS switches can reliably have less dispersion, and the S/N ratio can be reliably improved.

According to a fourth aspect of this invention based on the second aspect thereof, preferably, the cells of the battery pack be numbered in an order of decreasing an electric potential, the first floating line be disposed on the front surface of the circuit substrate, the second floating line be disposed on the back surface of the circuit substrate, the first photo MOS switches be disposed on the front surface of the circuit substrate as the first portion of the multiplexer and connect positive terminals of odd-numbered cells of the cells and the first floating line through a part of the potential detecting substrate surface lines, respectively, and the second photo MOS switches be disposed on the back surface of the circuit substrate as the second portion of the multiplexer and connect positive terminals of even-numbered cells of the cells and the second floating line through the remaining part of the potential detecting substrate surface lines, respectively.

In this configuration, no line passes through a via-hole of the circuit substrate. Accordingly, the configuration of the voltage detecting apparatus can be simplified.

According to a fifth aspect of this invention based on the second aspect thereof, preferably, the flying capacitor type battery voltage detector further comprise a differential amplifier which receives a difference between electric potentials applied to the flying capacitor through the analog switch, amplifies the electric potential difference to an amplified electric potential difference, and outputs the amplified electric potential difference as the form of the signal, amplifies the electric potential difference to an amplified electric potential difference, and outputs the amplified electric potential difference as the signal of the output voltage. The output voltage of each of the cells of the battery pack is applied to a pair of the terminals, the first and second photo MOS switches of each of the pairs set at the on state one by one connect the terminals of the corresponding pair with the first and second floating lines through the corresponding potential detecting substrate surface lines, respectively, and the second photo MOS switch set at the on state is substantially lying over the first photo MOS switch set at the on state in the thickness direction of the circuit substrate.

In this configuration, the first and second photo MOS switches of each pair receive electric potentials similar to each other from the terminals of one of the cells. Accordingly, leakage of an electric current from one of the corresponding potential detecting substrate surface lines to the other can be reduced.

Further, the first and second photo MOS switch of each pair are positioned adjacent to each other through the circuit substrate. Therefore, the corresponding potential detecting substrate surface lines are positioned adjacent to each other through the circuit substrate, and portions of the first and second floating lines near to the first and second photo MOS switches are positioned adjacent to each other through the circuit substrate. In this case, even though noises of the electromagnetic induction and/or electrostatic induction are superimposed on signals of the potential detecting substrate surface lines or signals of the first and second floating lines, the noises of one surface line disposed on the front surface have the same mode or phase as those of the other surface line disposed on the back surface. Therefore, when the signals of the electric potentials including the noises are transmitted from the surface lines to the differential amplifier, the noises of the signals can be mutually cancelled out in the differential amplifier. Accordingly, the S/N ratio of each signal outputted from the differential amplifier can be improved.

According to a sixth aspect of this invention based on the first aspect thereof, it is preferred that the flying capacitor type battery voltage detector further comprises a differential amplifier which receives a difference between electric potentials applied to the flying capacitor through the analog switch, amplifies the electric potential difference to an amplified electric potential difference, and outputs the amplified electric potential difference as the form of the signal. The potential detecting substrate surface lines of each selected pair, respectively, electrically connected with the first and second floating lines by the multiplexer are disposed on the front and second surfaces of the circuit substrate, respectively, and the potential detecting substrate surface line electrically connected with the second floating line is substantially lying over the potential detecting substrate surface line electrically connected with the first floating line in the thickness direction of the circuit substrate.

In this configuration, even though noises of the electromagnetic induction and/or noises of electrostatic induction are superimposed on signals of the lines, the noises of one line disposed on the front surface have the same mode or phase as those of the other line disposed on the back surface. Therefore, when the signals of the electric potentials including the noises are transmitted from the lines to the differential amplifier, the noises of the signals can be cancelled out in the differential amplifier. Accordingly, the S/N ratio of each signal outputted from the differential amplifier can be improved.

Further, an area occupied by the potential detecting substrate surface lines is divided into an area of the front surface and an area of the back surface, so that each of the potential detecting substrate surface lines can be shortened. Accordingly, the area occupied by the potential detecting substrate surface lines on the surfaces of the circuit substrate can be reduced.

According to a seventh aspect of this invention based on the second aspect thereof, preferably, the potential detecting substrate surface lines be disposed substantially parallel to one another in surface line areas of the front and back surfaces of the circuit substrate, the first and second photo MOS switches be disposed on both sides of each of the surface line areas, and the first and second photo MOS switches be arranged in a line substantially parallel to each of the potential detecting substrate surface lines on each of the sides of the surface line areas.

In this configuration, length of each potential detecting substrate surface line connected with the corresponding photo MOS switch is efficiently shortened. Accordingly, noises based on wiring resistances of the potential detecting substrate surface lines can be reduced, and the S/N ratio can be improved.

According to an eighth aspect of this invention based on the seventh aspect thereof, preferably, the flying capacitor type battery voltage detector further comprise a connector which is disposed at a side of the circuit substrate and connects the potential detecting substrate surface lines with the terminals of the battery pack, respectively. Each of the potential detecting substrate surface lines extends at almost right angles to an extending direction of the side of the circuit substrate.

In this configuration, length of each potential detecting substrate surface line between the connector and the corresponding photo MOS switch is further shortened. Accordingly, the S/N ratio can be further improved.

According to a ninth aspect of this invention based on the second aspect thereof, it is preferred that the flying capacitor type battery voltage detector further comprises a differential amplifier which receives a difference between electric potentials applied to the flying capacitor through the analog switch, amplifies the electric potential difference to an amplified electric potential difference, and outputs the amplified electric potential difference as the form of the signal. The potential detecting substrate surface lines are disposed substantially parallel to one another in surface line areas of the front and back surfaces of the circuit substrate, the first and second photo MOS switches are disposed on a side of each of the surface line areas, and the first and second photo MOS switches are arranged in a line substantially parallel to each of the potential detecting substrate surface lines on each of the sides of the surface line areas.

In this configuration, the potential detecting substrate surface lines are gathered in a narrow surface line area on each of the surfaces of the circuit substrate, and two potential detecting substrate surface lines of each pair connected with the first and second floating lines through the corresponding photo MOS switches can be placed adjacent to each other. Therefore, even though noises of the electromagnetic induction and/or the electrostatic induction are superimposed on signals of the lines, the noises of the potential detecting substrate surface lines placed adjacent to each other have the same mode as each other. Accordingly, the noises of the potential detecting substrate surface lines can be easily canceled out each other in the differential amplifier, and the S/N ratio can be further improved.

According to a tenth aspect of this invention based on the ninth aspect thereof, preferably, the flying capacitor type battery voltage detector further comprise a connector which is disposed at a side of the circuit substrate and connects the potential detecting substrate surface lines with the terminals of the battery pack, respectively. The potential detecting substrate surface lines are disposed between the connector and the multiplexer, and each of the potential detecting substrate surface lines extends substantially parallel to an extending direction of the side of the circuit substrate.

In this configuration, length of each potential detecting substrate surface line can be further shortened so as to reduce noises based on wiring resistances of the lines, and the S/N ratio can be further improved.

According to an eleventh aspect of this invention based on the first aspect thereof, it is preferred that the first and second floating lines are disposed on the surfaces of the circuit substrate different from each other, respectively, and the second floating line be substantially lying over the first floating line in the thickness direction of the circuit substrate.

In this configuration, the first and second floating lines create a floating electrostatic capacitor into the circuit substrate between the first and second floating lines, and the floating electrostatic capacitor is arranged parallel to the flying capacitor. Accordingly, the capacitance of the flying capacitor can be substantially increased, and a small-sized flying capacitor can be used for the flying capacitor type battery voltage detector.

According to an twelfth aspect of this invention based on the first aspect thereof, the flying capacitor type battery voltage detector may further comprise a control unit which controls the multiplexer according to a predetermined time schedule to select the pairs of the potential detecting substrate surface lines one by one and to electrically connect the selected pair of the potential detecting substrate surface lines with the first and second floating lines, respectively, controls the analog switch according to the predetermined time schedule to be maintained in the off state when the potential detecting substrate surface lines of the selected pair are, respectively, connected with the first and second floating lines, and controls the analog switch according to the predetermined time schedule to be turned on when the potential detecting substrate surface lines of the selected pair, respectively, connected with the first and second floating lines are disconnected from the first and second floating lines.

In this configuration, the multiplexer and the analog switch can be reliably operated according to the predetermined time schedule under control of the control unit.

According to a thirteenth aspect of this invention, the object is achieved by the provision of a flying capacitor type battery voltage detector comprising a circuit substrate having a front surface and a back surface opposite to the front surface in its thickness direction, a plurality of potential detecting substrate surface lines which are each disposed on the front or back surface of the circuit substrate, first and second floating lines which are each disposed on the front or back surface of the circuit substrate, a multiplexer, a flying capacitor connected with the first and second floating lines, and an analog switch.

Difference from the first aspect is that the multiplexer has a plurality of photo MOS switches which are each disposed on the front or back surface of the circuit substrate and connects one of the potential detecting substrate surface lines with the first or second floating line such that a part of the photo MOS switches disposed on the back surface of the circuit substrate are substantially lying over the remaining part of the photo MOS switches disposed on the front surface of the circuit substrate through the circuit substrate in the thickness direction. The multiplexer sequentially turns on the photo MOS switches of each of pairs to connect the terminals of one of the pairs corresponding to the photo MOS switches of the pair with the first and second floating lines through the potential detecting substrate surface lines of one of the pairs corresponding to the photo MOS switches of the pair, respectively.

In this configuration, the photo MOS switches of the back surface are substantially lying over the photo MOS switches of the front surface in the thickness direction of the circuit substrate. Therefore, temperatures in the photo MOS switches are distributed in a narrower range, and on-state resistances of the photo MOS switches having a high temperature dependency are distributed in a narrow resistance range. Accordingly, degrees of reduction of the output voltages of the cells can be reduced to a narrow reduction range, and the S/N ratio can be improved.

DETAILED DESCRIPTION OF THE PREFERRED EMBODIMENTS

Figure 1:
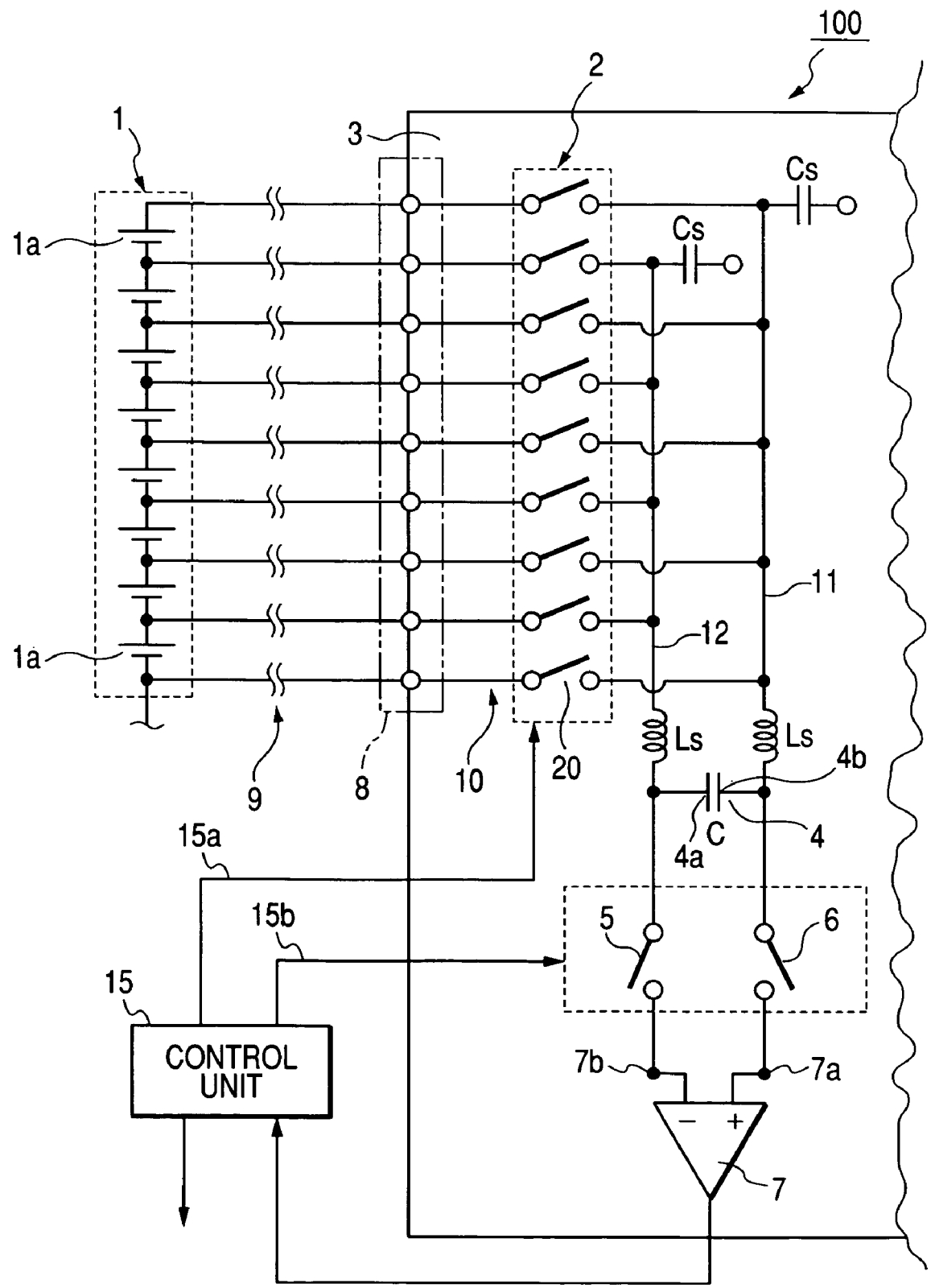
FIG. 1 is a circuit view showing a flying capacitor type battery voltage detector according to first and second embodiments of the present invention.

Preferred embodiments of a flying capacitor type battery voltage detector of a vehicle according to the present invention will now be described with reference to the accompanying drawings, in which like reference numerals indicate like parts, members or elements throughout the specification unless otherwise indicated.

Embodiment 1

FIG. 1 is a circuit view showing a flying capacitor type battery voltage detector according to a first embodiment.

As shown in FIG. 1, a battery pack 1 has a plurality of cells 1a connected with one another in series, and a potential detecting line 9 made of a cable extends from each of terminals of the cells 1a. The battery pack 1 has 384 cells 1a, and a part of the cells 1a are shown in FIG. 1. The number of potential detecting lines 9 is higher than the number of cells 1a by one. The cells 1a are numbered in an order of lowering an electric potential. The top potential detecting line 9 extends from a positive terminal of the top cell 1a at the highest electric potential, and the final potential detecting line 9 (not shown) extends from a negative terminal of the final cell 1a (not shown) set at the lowest electric potential. The electric energy created by the battery pack 1 is used to run a hybrid vehicle.

A flying capacitor type battery voltage detector 100 mounted on the hybrid vehicle has a circuit substrate 3, a plurality of potential detecting substrate surface lines 10 disposed on the circuit substrate 3, a connector section 8 fixed at a side of the circuit substrate 3 and connecting the potential detecting lines 9 and the potential detecting substrate surface lines 10, respectively, a multiplexer 2 disposed on the circuit substrate 3, and first and second floating lines 11 and 12 disposed on the circuit substrate 3.

The potential detecting substrate surface lines 10 are connected with the terminals of the cells 1a of the battery pack 1 through the potential detecting lines 9, respectively. The multiplexer 2 sequentially connects the potential detecting substrate surface lines 10 of each of pairs with the first and second floating lines 11 and 12, respectively, to connect the terminals of one cell 1a with the first and second floating lines, respectively.

The battery voltage detector 100 further has a flying capacitor 4 disposed on the circuit substrate 3, a differential amplifier 7, an output side sampling switch 5, and an output side sampling switch 6. The flying capacitor 4 has a terminal 4a connected with the first floating line 11 and a terminal 4b connected with the second floating line 12. The differential amplifier 7 has a terminal 7a connected with the first floating line 11 through the output side sampling switch 5 and a terminal 7b connected with the second floating line 12 through the output side sampling switch 6.

Each of the potential detecting substrate surface lines 10 has a wiring resistance. Each of the first and second floating lines 11 and 12 has a wiring resistance, a floating capacitance (or a parasitic capacitance) Cs and a wiring inductance Ls. The floating capacitance Cs is indicated by a capacitor Cs, and the wiring inductance Ls is indicated by an inductor Ls.

The multiplexer 2 has a plurality of photo MOS switches (or analog switches) 20. Each photo MOS switch 20 set at an on state electrically connects one potential detecting line 9 extending from one positive terminal of one odd-numbered cell 1a of the battery pack 1 and the first floating line 11, and electrically connects one potential detecting line 9 extending from one positive terminal of one even-numbered cell 1a of the battery pack 1 and the second floating line 12. The last photo MOS switch 20 set at an on state electrically connects one potential detecting line 9 extending from one negative terminal of the cell 1a of the lowest electric potential and the first floating line 11. The number of photo MOS switches 20 is higher by one than the number of cells 1a. Each of the output side sampling switches 5 and 6 belongs to an analog switch.

The battery voltage detector 100 further has a control unit 15 disposed outside the circuit substrate 3. The control unit 15 controls the multiplexer 2 to select each of pairs of photo MOS switches 20 connected with both terminals of one cell 1a according to a predetermined time schedule and to turn on the photo MOS switches 20 of the selected pair. Further, when the photo MOS switches 20 of the selected pair are turned on, the control unit 15 controls the output side analog switches 5 and 6 to maintain in an off state according to the predetermined time schedule. When the photo MOS switches 20 of the selected pair are turned off, the control unit 15 controls the output side analog switches 5 and 6 to turn on the output side analog switches 5 and 6.

In operation of the flying capacitor type battery voltage detector 100, when the output side analog switches 5 and 6 are maintained in an off state under control of the control unit 15, the control unit 15 selects each of pairs of photo MOS switches 20 connected with both terminals of one cell 1a in a predetermined order according to a predetermined time schedule and turns on the photo MOS switches 20 of the selected pair. Therefore, first and second electric potentials of the first and second floating lines 11 and 12 are applied to the terminals 4a and 4b of the flying capacitor 4 so as to give an electric energy created in each cell 1a to the flying capacitor 4.

Thereafter, the control unit 15 turns off the photo MOS switches 20 of the selected pair, so that the first and second surface lines 11 and 12 are set at the floating potential condition. Then, the control unit 15 turns on the output side analog switches 5 and 6 to electrically connect the first and second floating lines 11 and 12 with the terminals 7a and 7b of the differential amplifier 7. Therefore, a signal of a difference between the electric potentials is applied to the differential amplifier 7. The differential amplifier 7 amplifies the electric potential difference to an amplified electric potential difference in a form of a signal as a function of the output voltage of the cell 1a and outputs the signal to the control unit 15.

In response to the signal, the control unit 15 outputs a signal of the output voltage, turns off the output side analog switches 5 and 6, and turns on another pair of photo MOS switches 20 corresponding to both terminals of a next cell 1a. Therefore, the battery voltage detector 100 is operated in the same manner as a conventional flying capacitor type battery voltage detector to detect output voltages of the cells 1a of the battery pack 1 one by one and to output signals of the output voltages.

Next, an arrangement of the flying capacitor type battery voltage detector 100 on the circuit substrate 3 according to the first embodiment is described with reference to FIGS. 2 to 4.

Figure 2:
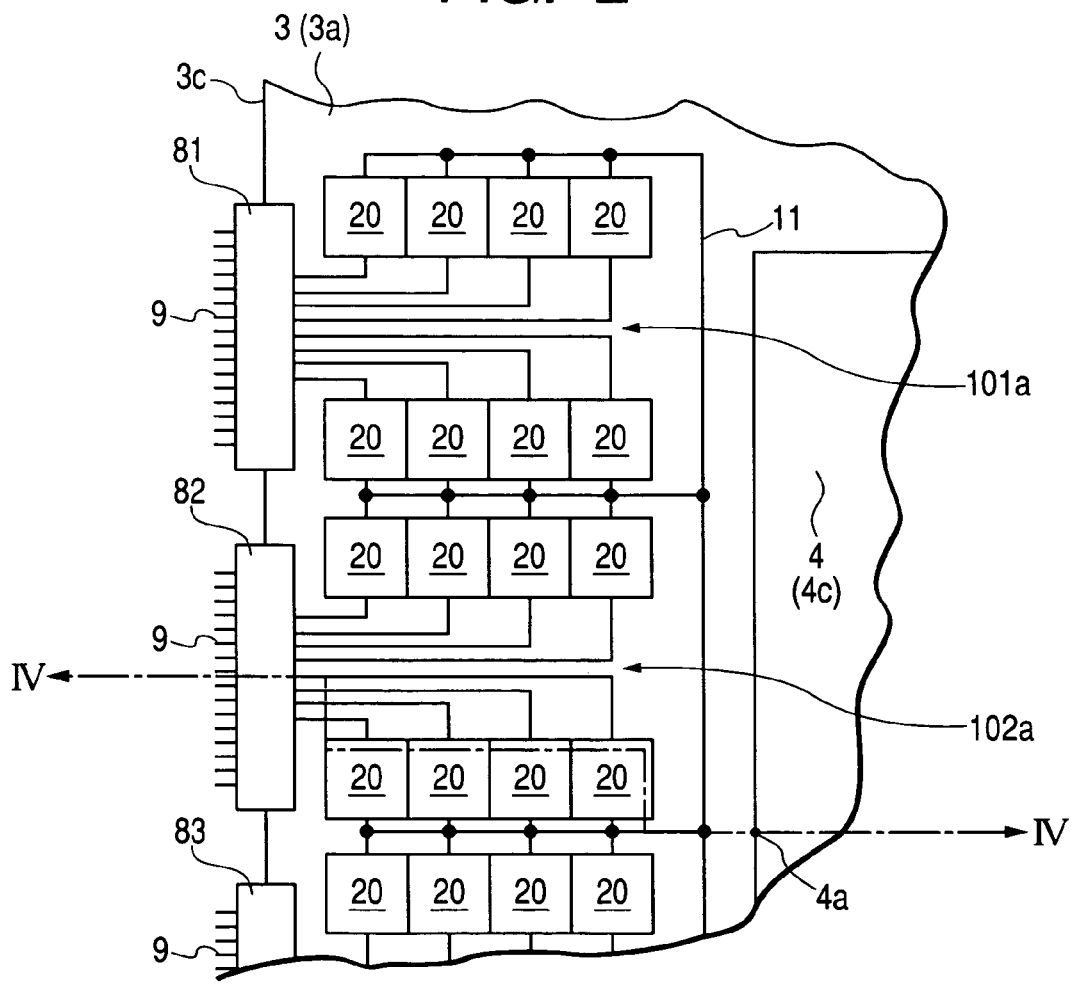
FIG. 2 is a partial plan view schematically showing an arrangement of constitutional elements disposed on a front surface of a circuit substrate in the flying capacitor type battery voltage detector shown in FIG. 1 according to the first embodiment.

FIG. 2 is a partial plan view schematically showing an arrangement of constitutional elements disposed on a front surface of the circuit substrate 3 in the flying capacitor type battery voltage detector shown in FIG. 1. FIG. 3 is a partial plan view schematically showing an arrangement of constitutional elements disposed on a back surface of the circuit substrate 3 in the flying capacitor type battery voltage detector shown in FIG. 1. FIG. 4 is a partial vertical cross-sectional view taken substantially along line IV-IV of FIG. 2.

The potential detecting lines 9 are classified into a plurality of first potential detecting lines 9 connected with positive terminals of the odd-numbered cells 1a (for example, first, third, - - - and 383-th cells), one first potential detecting line 9 connected with a negative terminal of the last cell 1a of the lowest electric potential, and a plurality of second potential detecting lines 9 connected with positive terminals of the even-numbered cells 1a (for example, second, fourth, - - - and 384th cells) The potential detecting substrate surface lines 10 are classified into a plurality of first potential detecting substrate surface lines 10 (101a, 102a, - - - ) disposed on a front surface 3a of the circuit substrate 3 and a plurality of second potential detecting substrate surface lines 10 (101b, 102b, - - - ) disposed on aback surface 3b of the circuit substrate 3 opposite to the front surface 3a in a thickness direction of the circuit substrate 3.

The connector section 8 has a plurality of connectors 81, 82, 83, - - - . Each of the connectors 81, 82 and 83 connects sixteen potential detecting lines 9 (eight first potential detecting lines 9 and eight second potential detecting lines 9) extending from sixteen positive terminals of a group of sixteen cells 1a and sixteen potential detecting substrate surface lines 10 (eight first potential detecting substrate surface lines and eight second potential detecting substrate surface lines), respectively. In this embodiment, there are twenty-four connectors for 385 potential detecting substrate surface lines 10 (385=16×23+17×1). Each of first twenty-three connectors connects sixteen potential detecting lines 9 and sixteen potential detecting substrate surface lines 10, and the final connector corresponding to the lowest electric potential connects seventeen potential detecting lines 9 and seventeen potential detecting substrate surface lines 10. For example, the connector 81 connects the eight first potential detecting substrate surface lines 101a with the first potential detecting lines 9 extending from the positive terminals of the odd-numbered cells 1a (first, third, - - - , and 15-th cells) set at the highest electric potentials and connects the eight second potential detecting substrate surface lines 101b with the second potential detecting lines 9 extending from the positive terminals of the even-numbered cells 1a (second, fourth, - - -, and 16-th cells) set at the highest electric potentials. The connector 82 connects the eight first potential detecting substrate surface lines 102*a* with the first potential detecting lines 9 extending from the positive terminals of the odd-numbered cells 1*a* (17-th, 19-th, - - -, and 31-th cells) set at the second highest electric potentials and connects the eight second potential detecting substrate surface lines 102*b* with the second potential detecting lines 9 extending from the positive terminals of the even-numbered cells 1*a* (18-th, 20-th, - - -, and 32-th cells) set at the second highest electric potentials.

The photo MOS switches 20 are also numbered in an order of decreasing an applied electric potential. The odd-numbered photo MOS switches 20 (for example, first, third, - - -, and 385th photo MOS switches 20) are disposed on the front surface 3*a* of the circuit substrate 3, and the even-numbered photo MOS switches 20 (for example, second, fourth, - - -, and 384th photo MOS switches 20) are disposed on the back surface 3*b* of the circuit substrate 3. Input terminals of the odd-numbered photo MOS switches 20 are connected with the first potential detecting substrate surface lines 10 (101*a*, 102*a*, - - -), and output terminals of the odd-numbered photo MOS switches 20 are connected with the first floating line 11. Input terminals of the even-numbered photo MOS switches 20 are connected with the second potential detecting substrate surface lines 10 (101*b*, 102*b*, - - -), and output terminals of the even-numbered photo MOS switches 20 are connected with the second floating line 12.

The first floating line 11 is disposed on the front surface 3*a* of the circuit substrate 3, and the second floating line 12 is disposed on the back surface 3*b* of the circuit substrate 3.

The flying capacitor 4 is divided into a first portion 4*c* disposed on the front surface 3*a* of the circuit substrate 3 and a second portion 4*d* disposed on the back surface 3*b* of the circuit substrate 3. A through hole (not shown) is opened in the circuit substrate 3 to penetrate the circuit substrate 3 from the front surface 3*a* to the back surface 3*b*, and the first portion 4*c* is directly connected with the second portion 4*d* in the through hole. The first floating line 11 is connected with the first portion 4*c* of the flying capacitor 4, and the second floating line 12 is connected with the second portion 4*d* of the flying capacitor 4.

Figure 4:
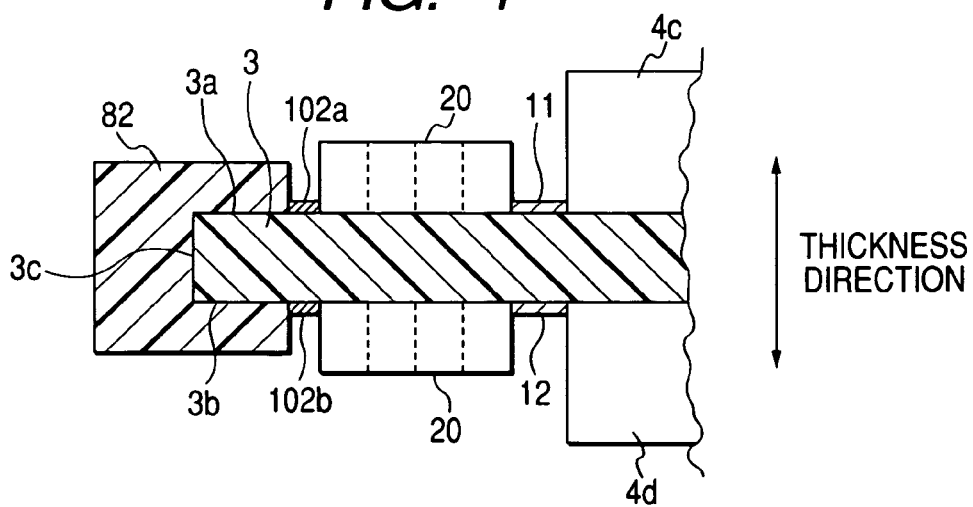
FIG. 4 is a partial vertical cross-sectional view taken substantially along line IV-IV of FIG. 2.

As shown in FIG. 2 and FIG. 4, the odd-numbered photo MOS switches 20, the connectors 81, 82, 83, - - -, the first potential detecting substrate surface lines 10 (101*a*, 102*a*, - - -), the first floating line 11 and the first portion 4*c* of the flying capacitor 4 are disposed on the front surface 3*a* of the circuit substrate 3. More particularly, the odd-numbered photo MOS switches 20 are disposed between the connector section 8 (81, 82, 83, - - -) and the first floating line 11. Each group of eight photo MOS switches 20 connected with one connector through eight first potential detecting substrate surface lines 10 (101*a*, 102*a*, - - -) is disposed between the connector and the first floating line 11. Four switches of the eight photo MOS switches 20 are arranged in a line to extend from an area near to one end of the connector to an area near to the first floating line 11, and the other four switches are arranged in a line to extend from an area near to the other end of the connector to an area near to the first floating line 11. The eight first potential detecting substrate surface lines 101*a*, 102*a*, - - - of each group almost straightly extend from the corresponding connector in parallel with one another at substantially right angles to the side 3*c* of the circuit substrate 3 in an area between the two groups of four photo MOS switches 20. Then, each of the first potential detecting substrate surface lines 10 is bent at an angle of almost 90 degrees toward the corresponding photo MOS switch 20 in front of the photo MOS switch 20 and is connected with the photo MOS switch 20.

Further, because there are 193 (=8×23+9×1) first potential detecting substrate surface lines 10 (101*a*, 102*a*, - - -), nine first potential detecting substrate surface lines 10 (101*a*, 102*a*, - - -) extend from the final connector (not shown). The nine photo MOS switches 20 corresponding to the nine surface lines 10 including the final surface line 10 is divided into a group of four photo MOS switches 20 and a group of five photo MOS switches 20 including the final photo MOS switch 20.

Figure 3:
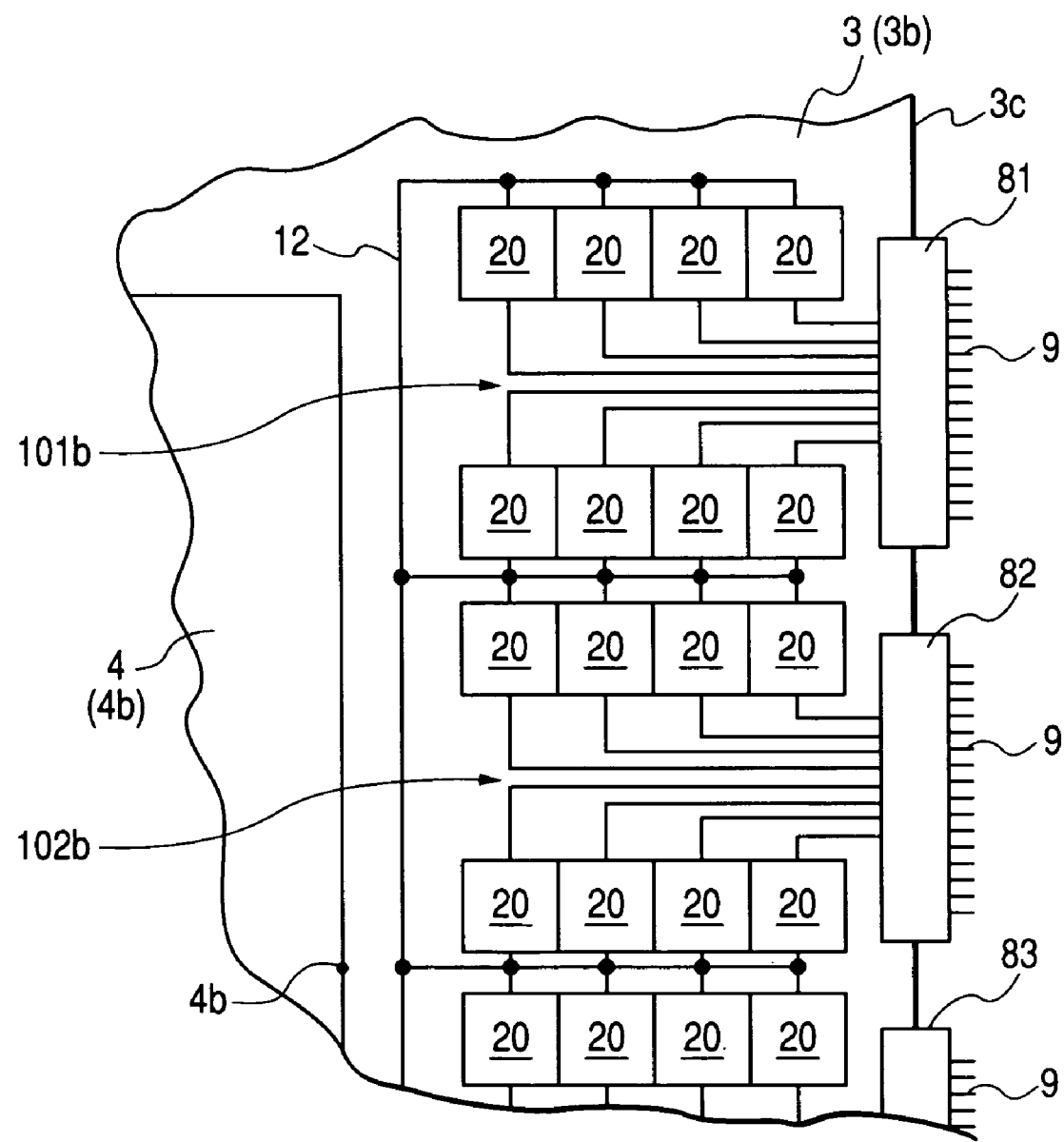
FIG. 3 is a partial plan view schematically showing an arrangement of constitutional elements disposed on a back surface of a circuit substrate in the flying capacitor type battery voltage detector shown in FIG. 1 according to the first embodiment.

As shown in FIG. 3 and FIG. 4, the even-numbered photo MOS switches 20, the connectors 81, 82, 83, - - -, the second potential detecting substrate surface lines 10 (101*b*, 102*b*, - - -), the second floating line 12 and the second portion 4*d* of the flying capacitor 4 are disposed on the back surface 3*b* of the circuit substrate 3 in the same arrangement as those disposed on the front surface 3*a* of the circuit substrate 3. More particularly, the even-numbered photo MOS switches 20 are disposed to be substantially lying over or overlap with the odd-numbered photo MOS switches 20 excepting the final photo MOS switch 20 when the even-numbered photo MOS switches 20 are seen from a thickness direction from the back surface 3*b* to the front surface 3*a* of the circuit substrate 3. Further, the odd-numbered photo MOS switch 20 and the even-numbered photo MOS switch 20 of each pair selected and simultaneously turned on by the control unit 15 are positioned to be substantially lying over each other when the photo MOS switches 20 are seen from the thickness direction.

The second potential detecting substrate surface lines 10 (101*b*, 102*b*, - - -) are disposed to be substantially lying over the first potential detecting substrate surface lines 10 (101*a*, 102*a*, - - -) excepting the final surface line 10 when the second potential detecting substrate surface lines 10 (101*b*, 102*b*, - - -) are seen from the thickness direction. Further, one first potential detecting substrate surface line 10 and one second potential detecting substrate surface line 10 of each pair corresponding to the photo MOS switches 20 selected and turned on by the control unit 15 are disposed so as to be substantially lying over each other when the first and second potential detecting substrate surface lines 10 are seen from the thickness direction of the circuit substrate 3.

The second floating line 12 is disposed to be substantially lying over the first floating line 11 when the second floating line 12 is seen from the thickness direction. The second portion 4*d* of the flying capacitor 4 is disposed to be substantially lying over the first portion 4*c* of the flying capacitor 4 when the second portion 4*d* is seen from the thickness direction.

Effects obtained in the above-described arrangement of the flying capacitor type battery voltage detector 100 shown in FIGS. 2 to 4 are described.

(1) The photo MOS switches 20 are divided into two groups, the group of odd-numbered photo MOS switches 20 is disposed on the front surface 3*a* of the circuit substrate 3, and the group of even-numbered photo MOS switches 20 is disposed on the back surface 3*b* of the circuit substrate 3. In this arrangement, each group of photo MOS switches 20 can be disposed in a narrow area of the corresponding surface of the circuit substrate 3 as compared with the case where all the photo MOS switches 20 are disposed on only one surface of the circuit substrate 3. As a result, lengths of the potential detecting substrate surface lines 10 connected with the photo MOS switches 20 and lengths of the first and second floating lines 11 and 12 connected with the photo MOS switches 20 are shortened.

Therefore, noises of the electromagnetic induction and electrostatic induction superimposed on signals of the potential detecting substrate surface lines 10 and signals of the first and second floating lines 11 and 12 can be reduced. Accordingly, an S/N ratio of each of signals outputted from the differential amplifier 7 can be improved. Further, because wiring resistances of the potential detecting substrate surface lines 10 and the first and second floating lines 11 and 12 are reduced, noises of the wiring resistances superimposed on the signals can be reduced. Accordingly, the S/N ratio of each signal can be further improved.

(2) Generally, a photo MOS switch functioning as an analog switch is actuated by using electric energy obtained by the photoelectric transfer. Therefore, an on-state resistance of the photo MOS switch is larger than that of a power switching device generally used, and the on-state resistance of the photo MOS switch has a high temperature dependency so as to be largely changed with temperature.

In this embodiment, the odd-numbered photo MOS switches and the even-numbered photo MOS switches 20 are disposed on the both surfaces 3a and 3b of the circuit substrate 3 such that the even-numbered photo MOS switches 20 are substantially lying over the odd-numbered photo MOS switches 20 when the even-numbered photo MOS switches 20 are seen from the thickness direction of the circuit substrate 3.

In this arrangement, even though the photo MOS switches 20 receive, from the circuit substrate 3, heat propagated in the circuit substrate 3 in plane directions perpendicular to the thickness direction according to the thermal conduction, a temperature distribution of the odd-numbered photo MOS switches 20 becomes almost the same as that of the even-numbered photo MOS switches 20. Therefore, temperatures in the photo MOS switches 20 can be distributed in a narrower temperature range as compared with the case where all the photo MOS switches 20 are disposed not to be lying over each other. As a result, on-state resistances of the photo MOS switches 20 having a high temperature dependency are distributed in a narrow resistance range. Accordingly, degrees of reduction of the output voltages of the cells 1a in the photo MOS switches 20 can be reduced to a narrow reduction range, and the S/N ratio can be improved.

(3) Further, the odd-numbered photo MOS switch 20 and the even-numbered photo MOS switch 20 of each pair selected and simultaneously turned on by the control unit 15 are positioned to be substantially lying over each other when the selected pair of photo MOS switches 20 is seen from the thickness direction.

In this arrangement, the odd-numbered photo MOS switch 20 and the even-numbered photo MOS switch 20 of each pair receive electric potentials similar to each other from the terminals of the corresponding cell 1a. Therefore, leakage of an electric current from one of the corresponding potential detecting substrate surface lines 10 to the other 10 can be reduced.

Further, because the photo MOS switches 20 of each pair substantially lying over each other are positioned adjacent to each other through the circuit substrate 3, the corresponding potential detecting substrate surface lines 10 are positioned adjacent to each other through the circuit substrate 3, and portions of the first and second floating lines 11 and 12 near to the photo MOS switches 20 are positioned adjacent to each other through the circuit substrate 3. In this case, even though noises of the electromagnetic induction and/or electrostatic induction caused by the coupling of the lines are superimposed on signals of the lines, the noises have the same mode or phase as each other. Therefore, when the signals indicating the electric potentials are received in the differential amplifier 7, the noises of one signal is subtracted from the noises of the other signal in the differential amplifier 7. As a result, the noises of the signals can be cancelled out. Accordingly, the S/N ratio of each signal outputted from the differential amplifier 7 can be improved.

(4) One first potential detecting substrate surface line 10 and one second potential detecting substrate surface line 10 of each pair corresponding to the photo MOS switches 20 turned on by the control unit 15 are disposed so as to be substantially lying over each other when the first and second potential detecting substrate surface lines 10 are seen from the thickness direction of the circuit substrate 3.

In this arrangement, even though noises of the electromagnetic induction and/or electrostatic induction caused by the coupling of the first and second potential detecting substrate surface lines 10 of the pair are superimposed on signals of the lines 10, the noises of one line 10 disposed on the front surface 3a have the same mode or phase as those of the other line 10 disposed on the back surface 3b. Therefore, when the signals of the electric potentials including the noises are received in the differential amplifier 7, the noises of the signals can be cancelled out. Accordingly, the S/N ratio of each signal outputted from the differential amplifier 7 can be improved.

(5) A group of eight photo MOS switches 20 is disposed on each of the surfaces 3a and 3b of the circuit substrate 3 for each connector, and eight potential detecting substrate surface lines 10 corresponding to each group of photo MOS switches 20 are arranged in a surface line area on the corresponding surface substantially parallel to one another. Four switches 20 of the group are arranged in a line on one side of the surface line area substantially parallel to the lines 10, and the other four switches 20 of the group are arranged in a line on the other side of the surface line area substantially parallel to the lines 10.

In this arrangement, length of each potential detecting substrate surface line 10 connected with the corresponding photo MOS switch 20 is efficiently shortened. Accordingly, noises based on wiring resistances of the potential detecting substrate surface lines 10 can be reduced, and the S/N ratio can be improved.

(6) The second floating line 12 is disposed to be substantially lying over the first floating line 11 when the second floating line 12 is seen from the thickness direction. In this arrangement, a difference in impedance between the floating lines 11 and 12 becomes very small. In this case, even though common mode noises are directly superimposed on signals of the lines 11 and 12 set at the floating potential condition, the common mode noises superimposed on a signal of the first floating line 11 can be preferably cancelled out with those of the second floating line 12 in the differential amplifier 7. Accordingly, the S/N ratio can be improved.

Further, the first and second floating lines 11 and 12 lying over each other create a floating electrostatic capacitor into the circuit substrate 3 between the first and second floating lines 11 and 12, and the floating electrostatic capacitor is arranged parallel to the flying capacitor 4. Accordingly, the capacitance of the flying capacitor 4 can be substantially increased, and a small-sized flying capacitor can be used for the flying capacitor type battery voltage detector.

Embodiment 2

Another arrangement of the flying capacitor type battery voltage detector 100 according to the second embodiment is described with reference to FIGS. 5 and 6.

Figure 5:
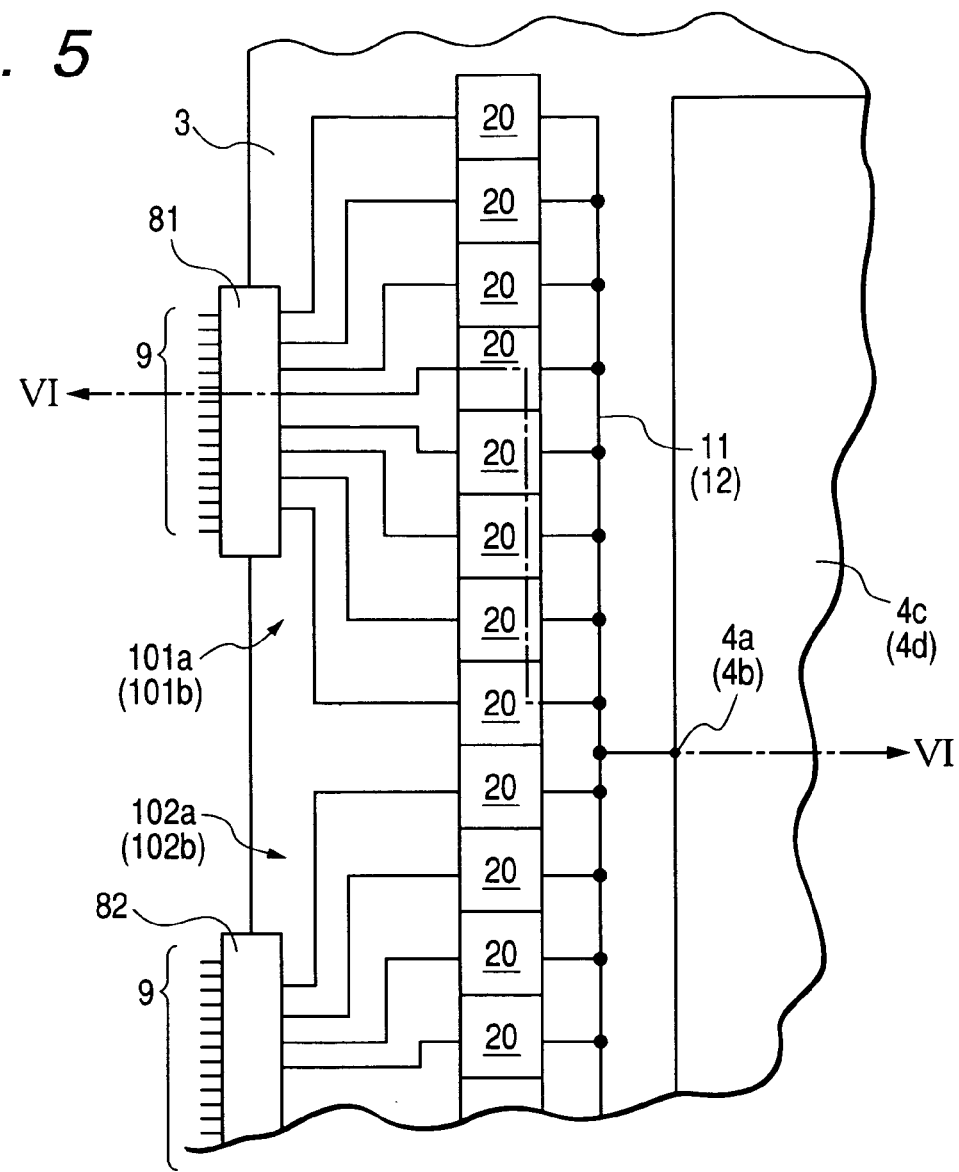
FIG. 5 is a partial plan view schematically showing an arrangement of constitutional elements disposed on each of front and back surfaces of a circuit substrate in the flying capacitor type battery voltage detector shown in FIG. 1 according to the second embodiment.

FIG. 5 is a partial plan view schematically showing an arrangement of constitutional elements disposed on each of the front and back surfaces of the circuit substrate in the flying capacitor type battery voltage detector shown in FIG. 1 according to the second embodiment. FIG. 6 is a partial vertical cross-sectional view taken substantially along line VI-VI of FIG. 5.

Figure 6:
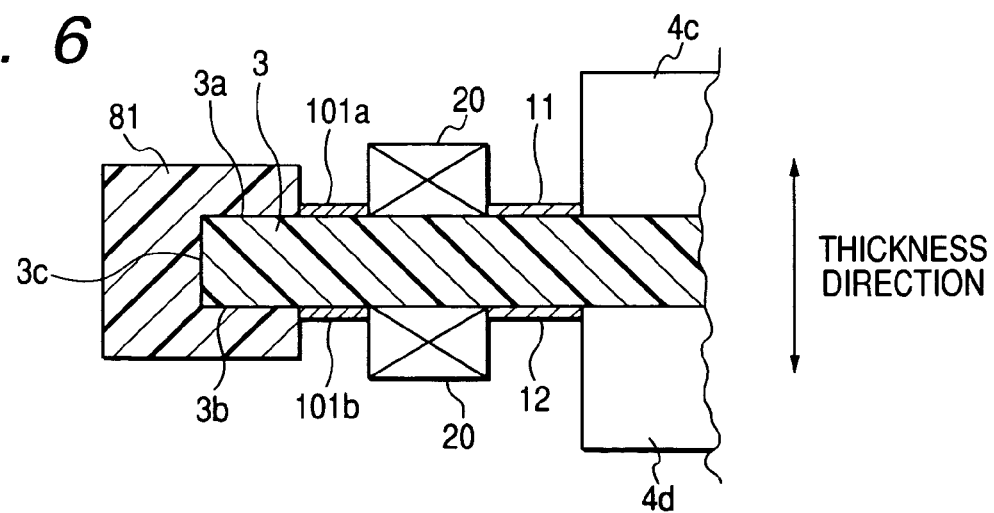
FIG. 6 is a partial vertical cross-sectional view taken substantially along line VI-VI of FIG. 5.

As shown in FIG. 5 and FIG. 6, on the front surface 3a of the circuit substrate 3, the odd-numbered photo MOS switches 20 are placed between the group of first potential detecting substrate surface lines 10 (101a, 102a, - - - ) and the first flying line 11, and the first potential detecting substrate surface lines 101a, 102a, - - - are placed between the connector section 8 of the connectors 81, 82, - - - and the odd-numbered photo MOS switches 20. Each of the connectors connects sixteen first potential detecting lines 9 and sixteen first potential detecting substrate surface lines in the same manner as in the first embodiment.

All the odd-numbered photo MOS switches 20 are arranged in a line substantially parallel to an extending direction of the side 3c of the circuit substrate 3 at which the connectors 81, 82, - - - are disposed. Each of the first potential detecting substrate surface lines 101a, 102a, - - - straightly extends from the corresponding connector toward the photo MOS switches 20 by a short length at substantially right angles to the side 3c of the circuit substrate 3 and is bent at substantially 90 degrees in a direction approaching the corresponding photo MOS switch 20. Then, the first potential detecting substrate surface line straightly extends substantially parallel to the extending direction of the side 3c of the circuit substrate 3 and is bent at substantially 90 degrees in front of the corresponding photo MOS switch 20 in a direction approaching the corresponding photo MOS switch 20 so as to be connected with the input terminal of the corresponding photo MOS switch 20.

On the back surface 3b of the circuit substrate 3, the even-numbered photo MOS switches 20, the group of second potential detecting substrate surface lines 10 (101b, 102b, - - - ) and the second flying line 12 are disposed in the same arrangement as those disposed on the front surface 3a of the circuit substrate 3. More particularly, the even-numbered photo MOS switches 20 are disposed to be substantially lying over or overlap with the odd-numbered photo MOS switches 20 excepting the final photo MOS switch 20 when the even-numbered photo MOS switches 20 are seen from the thickness direction of the circuit substrate 3. The odd-numbered photo MOS switch 20 and the even-numbered photo MOS switch 20 of each pair selected and simultaneously turned on by the control unit 15 are positioned to be substantially lying over each other when the photo MOS switches 20 are seen from the thickness direction.

Further, the second potential detecting substrate surface lines 101b, 102b, - - - are disposed to be substantially lying over the first potential detecting substrate surface lines 101a, 102a, - - - excepting the final surface line 10 when the second potential detecting substrate surface lines 101b, 102b, - - - are seen from the thickness direction. One first potential detecting substrate surface line and one second potential detecting substrate surface line of each pair, respectively, connected with the first and second floating lines 11 and 12 through the corresponding photo MOS switches 20 are disposed so as to be substantially lying over each other when the first and second potential detecting substrate surface lines 10 are seen from the thickness direction of the circuit substrate 3. The second floating line 12 is disposed to be substantially lying over the first floating line 11 when the second floating line 12 is seen from the thickness direction.

Therefore, the same effects as those obtained in the first embodiment can be obtained in the second embodiment, and an S/N ratio of each signal outputted from the differential amplifier 7 can be improved.

Modifications

In the first and second embodiments, the connectors 81, 82 and 83 are disposed at one side of the circuit substrate 3. However, the present invention should not be construed as limiting to the connectors disposed at one side of the circuit substrate 3. For example, a unified connector obtained by integrally forming the connectors with one another may be disposed at a side of the circuit substrate 3. Further, the connectors may be disposed at a plurality of sides of the circuit substrate 3, or the connectors or the unified connector may be disposed at a center position of the circuit substrate 3.

In the embodiments, the potential detecting substrate surface lines 10 disposed on the corresponding surface of the circuit substrate 3 are connected with the input terminals of the photo MOS switches 20 disposed on the same surface of the circuit substrate 3. However, a part of the first (or second) potential detecting substrate surface lines 10 or all the first (or second) potential detecting substrate surface lines 10 may be connected with the input terminals of the photo MOS switches 20 disposed on the back (or front) surface 3b (3a) through via-holes opened in the circuit substrate 3.

Further, in the embodiments, the output terminals of the photo MOS switches 20 disposed on the front (or back) surface 3a (3b) are connected with the first (or second) flying line 11 (12) disposed on the front (or back) surface 3a (3b) of the circuit substrate 3. However, a part of the photo MOS switches 20 or all the photo MOS switches 20 disposed on the front (or back) surface 3a (3b) may be connected with the second (or first) flying line 12 (11) disposed on the back (or front) surface 3b (3a) through via-holes opened in the circuit substrate 3.

Further, in the embodiments, the first and second flying line 11 and 12 are disposed on the different surfaces. However, the first and second flying line 11 and 12 may be disposed on the same surface 3a or 3b of the circuit substrate 3.

Moreover, in the embodiments, the flying capacitor type battery voltage detector 100 detects output voltages of the cells 1a of the battery pack 1 one by one. However, the battery voltage detector 100 may detect output voltages of a plurality of groups of cells 1a of the battery pack 1 one by one.

What is claimed is:

1. A flying capacitor type battery voltage detector, comprising:
    a circuit substrate having a front surface and a back surface opposite to the front surface in a thickness direction of the circuit substrate;
    a plurality of potential detecting substrate surface lines which are each disposed on the front or back surface of the circuit substrate, the potential detecting substrate surface lines being connected with a plurality of terminals of cells or groups of cells of a battery pack, respectively;

a first floating line disposed on the front or back surface of the circuit substrate;

a second floating line disposed on the front or back surface of the circuit substrate;

a multiplexer including a first portion disposed on the front surface of the circuit substrate and a second portion disposed on the back surface of the circuit substrate such that the second portion substantially lies over the first portion through the circuit substrate in the thickness direction of the circuit substrate, the multiplexer sequentially connecting pairs of the potential detecting substrate surface lines, being connected with the terminals of each cell or each group of cells, with the first and second floating lines, respectively;

a flying capacitor, connected with the first and second floating lines, which holds an electric energy transmitted from each cell or each group of cells through the pairs of the potential detecting substrate surface lines connected with the terminals of each cell or each group of cells and the first and second floating lines; and an analog switch which is maintained in an off state when the pairs of the potential detecting substrate surface lines connected with the terminals of each cell of each group of cells are, respectively, connected with the first and second floating lines by the multiplexer, and which is turned on when the pairs of the potential detecting substrate surface lines are disconnected from the first and second floating lines, the electric energy of the flying capacitor being outputted through the analog switch when turned on in a form of a signal as a function of an output voltage appearing between the terminals of each cell or each group of cells.

2. The flying capacitor type battery voltage detector according to claim 1, wherein the multiplexer comprises a plurality of first photo MOS switches connecting a part of the potential detecting substrate surface lines with the first floating line when being set at an on state, and a plurality of second photo MOS switches connecting the remaining part of the potential detecting substrate surface lines with the second floating line when being set at an on state, and wherein a plurality of pairs of the first and second photo MOS switches are set at the on state one by one.

3. The flying capacitor type battery voltage detector according to claim 2, wherein the first and second photo MOS switches of the second portion of the multiplexer are substantially lying over the first and second photo MOS switches of the first portion of the multiplexer through the circuit substrate in the thickness direction of the circuit substrate.

4. The flying capacitor type battery voltage detector according to claim 2, wherein the cells of the battery pack are numbered in an order of decreasing an electric potential, the first floating line is disposed on the front surface of the circuit substrate, the second floating line is disposed on the back surface of the circuit substrate, the first photo MOS switches are disposed on the front surface of the circuit substrate as the first portion of the multiplexer and connect positive terminals of odd-numbered cells of the cells and the first floating line through a part of the potential detecting substrate surface lines, respectively, and the second photo MOS switches are disposed on the back surface of the circuit substrate as the second portion of the multiplexer and connect positive terminals of even-numbered cells of the cells and the second floating line through the remaining part of the potential detecting substrate surface lines, respectively.

5. The flying capacitor type battery voltage detector according to claim 2, further comprising a differential amplifier which receives a difference between electric potentials applied to the flying capacitor through the analog switch, amplifies the electric potential difference to an amplified electric potential difference, and outputs the amplified electric potential difference as the form of the signal, wherein the output voltage of each of the cells of the battery pack is applied to a pair of the terminals, the first and second photo MOS switches of each of the pairs set at the on state one by one connect the terminals of the corresponding pair with the first and second floating lines through the corresponding potential detecting substrate surface lines, respectively, and the second photo MOS switch set at the on state is substantially lying over the first photo MOS switch set at the on state in the thickness direction of the circuit substrate.

6. The flying capacitor type battery voltage detector according to claim 1, further comprising a differential amplifier which receives a difference between electric potentials applied to the flying capacitor through the analog switch, amplifies the electric potential difference to an amplified electric potential difference, and outputs the amplified electric potential difference as the form of the signal, wherein the potential detecting substrate surface lines of each pair, respectively, connected with the first and second floating lines by the multiplexer are disposed on the front and second surfaces of the circuit substrate, respectively, and the potential detecting substrate surface line connected with the second floating line is substantially lying over the potential detecting substrate surface line connected with the first floating line in the thickness direction of the circuit substrate.

7. The flying capacitor type battery voltage detector according to claim 2, wherein the potential detecting substrate surface lines are disposed substantially parallel to one another in surface line areas of the front and back surfaces of the circuit substrate, the first and second photo MOS switches are disposed on both sides of each of the surface line areas, and the first and second photo MOS switches are arranged in a line substantially parallel to each of the potential detecting substrate surface lines on each of the sides of the surface line areas.

8. The flying capacitor type battery voltage detector according to claim 7, further comprising a connector which is disposed at a side of the circuit substrate and connects the potential detecting substrate surface lines with the terminals of the battery pack, respectively, wherein each of the potential detecting substrate surface lines extends at almost right angles to an extending direction of the side of the circuit substrate.

9. The flying capacitor type battery voltage detector according to claim 2, further comprising a differential amplifier which receives a difference between electric potentials applied to the flying capacitor through the analog switch, amplifies the electric potential difference to an amplified electric potential difference, and outputs the amplified electric potential difference as the form of the signal, wherein the potential detecting substrate surface lines are disposed substantially parallel to one another in surface line areas of the front and back surfaces of the circuit substrate, the first and second photo MOS switches are disposed on a side of each of the surface line areas, and the first and second photo MOS switches are arranged in a line substantially parallel to each of the potential detecting substrate surface lines on each of the sides of the surface line areas.

10. The flying capacitor type battery voltage detector according to claim 9, further comprising a connector which is disposed at a side of the circuit substrate and connects the potential detecting substrate surface lines with the terminals of the battery pack, respectively, wherein the potential detecting substrate surface lines are disposed between the connector and the multiplexer, and each of the potential detecting substrate surface lines extends substantially parallel to an extending direction of the side of the circuit substrate.

11. The flying capacitor type battery voltage detector according to claim 1, wherein the first and second floating lines are disposed on the surfaces of the circuit substrate different from each other, respectively, and the second floating line is substantially lying over the first floating line in the thickness direction of the circuit substrate.

12. The flying capacitor type battery voltage detector according to claim 1, further comprising a control unit which controls the multiplexer according to a predetermined time schedule to sequentially connect each of the pairs of the potential detecting substrate surface lines with the first and second floating lines, respectively, controls the analog switch according to the predetermined time schedule to be maintained in the off state when the potential detecting substrate surface lines of the selected pair are, respectively, connected with the first and second floating lines, and controls the analog switch according to the predetermined time schedule to be turned on when the potential detecting substrate surface lines of the selected pair are disconnected from the first and second floating lines.

13. A flying capacitor type battery voltage detector, comprising:

a circuit substrate having a front surface and a back surface opposite to the front surface in a thickness direction of the circuit substrate;

a plurality of potential detecting substrate surface lines which are each disposed on the front or back surface of the circuit substrate, the potential detecting substrate surface lines being connected with a plurality of terminals of cells or groups of cells of a battery pack, respectively;

a first floating line disposed on the front or back surface of the circuit substrate;

a second floating line disposed on the front or back surface of the circuit substrate;

a multiplexer, having a plurality of photo MOS switches each of which is disposed on the front or back surface of the circuit substrate and connects one of the potential detecting substrate surface lines with the first or second floating line such that a part of the photo MOS switches disposed on the back surface of the circuit substrate are substantially lying over the remaining part of the photo MOS switches disposed on the front surface of the circuit substrate through the circuit substrate in the thickness direction, the multiplexer sequentially turning on pairs of the photo MOS switches connected with the terminals of each cell or each group of cells through pairs of the potential detecting substrate surface lines to connect the terminals of each cell or each group of cells with the first and second floating lines through the pairs of the potential detecting substrate surface lines, respectively;

a flying capacitor, connected with the first and second floating lines, which holds an electric energy transmitted from each cell or each group of cells through the pairs of the potential detecting substrate surface lines connected with the terminals of each cell or the group of cells, the photo MOS switches connected with the pairs of the potential detecting substrate surface lines and the first and second floating lines; and an analog switch which is maintained in an off state when the multiplexer turns on the photo MOS switches connected with the terminals of each cell or each group of cells through the pairs of the potential detecting substrate surface lines, and which is turned on when the multiplexer turns off all the photo MOS switches, the electric energy of the flying capacitor being outputted through the analog switch when turned on in a form of a signal as a function of an output voltage appearing between the terminals of each cell or each group of cells.

* * * * *